United States Patent
Muehl et al.

(12) 
(10) Patent No.: US 6,306,779 B1
(45) Date of Patent: Oct. 23, 2001

(54) METHOD FOR NANO-STRUCTURING AMORPHOUS CARBON LAYERS

(75) Inventors: Thomas Muehl, Dresden; Guenter Reiss; Hubert Brueckl, both of Bielefeld, all of (DE)

(73) Assignee: Institut fuer Festkoerper-und Werkstofforschung Dresden e.V., Dresden (DE)

( * ) Notice: Subject to any disclaimer, the term of this patent is extended or adjusted under 35 U.S.C. 154(b) by 0 days.

(21) Appl. No.: 09/463,868

(22) PCT Filed: Jul. 22, 1998

(86) PCT No.: PCT/EP98/04600
§ 371 Date: May 3, 2000
§ 102(e) Date: May 3, 2000

(87) PCT Pub. No.: WO99/06996
PCT Pub. Date: Feb. 11, 1999

(30) Foreign Application Priority Data

Aug. 2, 1997 (DE) .............................. 197 33 520

(51) Int. Cl.[7] .................. H01L 21/26; H01L 21/324; H01L 21/42; H01L 21/477

(52) U.S. Cl. .............................. 438/795; 438/96; 438/48

(58) Field of Search .............................. 438/96, 795, 49, 438/48

(56) References Cited

U.S. PATENT DOCUMENTS

| | | | |
|---|---|---|---|
| 4,802,951 | * 2/1989 | Clark et al. | 156/630 |
| 4,896,044 | 1/1990 | Li et al. | 250/492.3 |
| 5,343,042 | * 8/1994 | Fuchs et al. | 250/307 |
| 5,504,338 | 4/1996 | Marrian et al. | 250/492.2 |

OTHER PUBLICATIONS

K. Kragler et al., Scanning tunneling microscopy based lithography employing amorphous hydrogenated carbon as a high resolution resist mask, Appl. Phys. Lett. 67 (8), Aug. 21, 1995.

K. Kragler et al., Low–voltage electron–beam lithography with scanning tunneling microscopy in air: A new method for producing structures with high aspect ratios, J. Vac. Sci. Technol. B 14(2), Mar./Apr. 1996.

G. A. Porkolab et al., Etch masks of semimetallic amorphous carbon thin films produced by electron–beam sublimation of graphitic carbon, J. Vac. Sci. Technol. B 10(6), Nov./Dec. 1992.

Jayshree Seth et al., Lithographic application of diamondlike carbon films, Thin Solid Films 254 (1995) 92 95.

(List continued on next page.)

Primary Examiner—Amir Zarabian
Assistant Examiner—Bradley Smith
(74) Attorney, Agent, or Firm—Reed Smith LLP

(57) ABSTRACT

The invention relates to the production or treatment of semiconductor or other solid components, especially to a method for directly nano-structuring amorphous carbonlayers. According to the invention, a local, field-induced reaction is activated in the carbon with an electrically conductive or semiconducting probe. Said probe is positioned at a distance from the amorphous carbon layer or is passed over said amorphous carbon layer at a distance. The distance must be such that the electrical conduction mechanism 'field emission' or 'tunnelling' can still occur. An electrical voltage is applied to said probe in relation to the layer at the points where recesses are to be made in the layer or the layer is to be removed. This process alone produces the desired structure without any further technical steps. The inventive method can be used advantageously in the production of electronic components in the sub-$\mu$m and nm areas, and is particularly suitable in those fields for producing nano-structured etching masks whose structures have to be transferred onto layers placed beneath them. The method can also be used advantageously for entering information into amorphous carbon layers for information storage.

13 Claims, 1 Drawing Sheet

OTHER PUBLICATIONS

Christian Schönenberger et al., Nanolithography on hydrogen–terminated silicon by scanning–probe microscopy, Microelectronic Engineering 32 (1996) 203–217.

G. Danev et al., An $AS_2S_3$/C bilayer resist system for submicron lithography, Vacuum/vol. 44/Nos. 11/12/pp. 1123 to 1126/1993. Printed in Great Britain.

J. A. Dagata et al., Modification of hydrogen–passivated silicon by a scanning tunneling microscope operating in air, Appl. Phys. Lett. 56 (20), May 14, 1990.

F. Perez–Murano et al., Nanometer–scale oxidation of Si(100) surfaces by tapping mode atomic force microscopy, J. Appl. Phys. 78 (11), Dec. 1, 1995.

Dawen Wang et al., Nanofabrication of thin chromium film deposited on Si(100) surface by tip induced anodization in atomic force microscopy, Appl. Phys. Lett 67 (9), Aug. 28, 1995.

H. W. Schumacher et al., Modification of thin gold films with a scanning force microscope, Thin Solid Films 264 (1995) 268–272.

Takeo Hattori et al., Fabrication of nanometer–scale structures using atomic force microscope with conducting probe, J. Vac. Sci. Technol. A 12(4), Jul./Aug. 1994.

* cited by examiner

METHOD FOR NANO-STRUCTURING AMORPHOUS CARBON LAYERS

BACKGROUND OF THE INVENTION a) Field of the Invention

The invention relates to the field of production or treatment of semiconductor components or other solid-state components and is directed to a method for nanostructuring of amorphous carbon layers.

The method is advantageously applicable in the production of electronic components in the submicrometer range and in the nanometer range and, in this connection, is suitable particularly for generating nanostructured etch masks whose structure is to be transferred to layers located below them. Further, the method according to the invention can be applied for entering information in amorphous carbon layers for the purpose of storing information.

b) Description of the Related Art

Previously, masks for structure transfer into underlying layers by etching or for application of the lift-off method were produced by photolithography and with electron beam lithography. Further, various possibilities are known for generating structures with structure sizes in the nanometer range by scanning probe microscopes. For example, electron beam sensitive lacquers or resists can be exposed by scanning tunneling microscopes (E. A. Dobisz and C. R. K. Marrian, *Appl. Phys. Lett.* 58, 2526 (1991)), and scanning force microscopes are used for mechanical modification of layers (V. Bouchiat and D. Esteve, *Appl. Phys. Lett.* 69, 3098 (1996)) or metal conductor paths (R. Rank, H. Brückl, J. Kretz, I. Mönch and G. Reiss, *Vacuum* 48, 467 (1997)) and for field-induced local oxidation of silicon (C. Schönenberger, N. Kramer, *Microelectron. Eng.* 32, 203 (1996)).

Within the group of inorganic resist materials, amorphous carbon layers hold an important place (K. Kragler, E. Günther, R. Leuschner, G. Falk, A. Hammerschmidt, H. von Seggern and G. Saemann-lschenko, *Appl. Phys. Lett.* 67, 1163 (1995)). Among the advantages are that the reactivity of the amorphous carbon with most substrates is negligible, amorphous carbon is resistant to halogen plasma, so that structured carbon films are suitable as etch masks for halogen-plasma etching for structure transfer into underlying layers. Carbon films can easily be removed by means of reactive ion etching with oxygen or hydrogen.

It is known that amorphous carbon layers can be structured in that the structure of a layer lying above the carbon is transferred into the carbon by etching.

Direct structuring of amorphous carbon films by means of etching in the electron beam in a defined oxygen environment is also known. Structure sizes down to 0.5 µm have been achieved by this method (D. Wang, P. C. Hoyle, J. R. A. Cleaver, G. A. Porkolab and N. C. MacDonald, *J. Vac. Sci. Technol.* B 13, 1984 (1995)). While the reaction products are volatile in an advantageous manner in this case, a substantial disadvantage of this method consists in that structures generated in this manner in the amorphous carbon cannot be transferred into silicon substrates lying below the carbon layer because an etch-resistant layer occurs at the silicon surface during structuring.

Local graphitization of diamond-like carbon films in the focus of a laser and production of masks through the use of the different oxygen plasma etch rates of graphite and diamond-like carbon are also known. In this way, structures with sizes in the range of 5 µm could be generated (J. Seth, S. V. Babu, V. G. Ralchenko, T. V. Kononenko, V. P. Ageev and V. E. Strelnitsky, *Thin Solid Films*, 254, 92 (1995)).

OBJECT AND SUMMARY OF THE INVENTION

It is the primary object of the invention to generate structures with sizes in the nanometer range in amorphous carbon layers by means of a direct structuring.

This object is met by the inventive method described herein for nanostructuring of amorphous carbon layers.

According to the invention, a local field-induced reaction of the carbon is activated by an electrically conductive or semiconducting probe which is located above or guided over the amorphous carbon layer at a distance in which the electric conduction mechanism of the field emission or of tunneling is possible and to which an electric voltage is applied relative to the layer at locations where depressions are introduced in the layer or the layer is to be removed. The reaction products occurring in this way are advantageously volatile, so that the desired structure is formed with an additional technological step.

The electrically conductive or semiconducting probe is advisably located at a distance of up to 10 nm above the amorphous carbon layer or is guided over the latter.

According to the invention, the electric voltage applied to the probe can be a negative DC voltage potential with a minimum voltage in the range of 3 to 8 volts relative to the layer or can be an AC voltage.

Corresponding to an advisable arrangement of the invention, the distance between the electrically conductive or semiconducting probe and the amorphous carbon layer can be defined by an electrically insulating layer with a thickness of up to several nanometers which is located on the surface of the probe.

According to the invention, the reaction can be carried out in an oxygen environment, wherein oxides of the carbon occur as reaction products or the reaction is carried out in a hydrogen environment or a nitrogen environment.

According to an advisable arrangement of the invention, the nanostructuring can be carried out by means of a scanning probe microscope, wherein the electrically conducting or semiconducting probe of the microscope is used for the field-induced reaction of the carbon.

A structured electrode whose structure is formed as the negative of the nanostructure to be achieved in the layer can also be used as electrically conducting probe. An electrode of this kind is then worked into the amorphous carbon layer and, in doing so, transfers its structure.

Corresponding to an arrangement of the invention, the distance between the electrically conductive or semiconducting probe and the amorphous carbon layer can be changed periodically over time during the structuring.

Corresponding to another arrangement of the invention, the negative DC voltage potential can also be changed periodically over time during the structuring.

According to the invention, an electrically conductive or semiconducting probe of silicon can also be used, wherein the polarity of the DC voltage potential is reversed during the structuring at determined intervals for determined times. In this case, a layer of silicon oxide is formed on the surface of the probe by field-induced oxidation or a layer of this kind is reproduced.

Instead of a DC voltage source, a constant current source can also be used according to the invention, wherein the junction resistance or transition resistance between the electrically conductive or semiconducting probe and the amorphous carbon layer is to be adjusted in such a way that a determined minimum voltage is achieved during the structuring.

The invention further provides that the method according to the invention is used for the purpose of storing digital or analog information in that structures representing digital or analog information are introduced into amorphous carbon layers by the nanostructuring according to the invention.

The method according to the invention has several substantial advantages over the prior art. It is particularly advantageous that the structures can be generated in the carbon layers by means of direct structuring since the reaction products of the carbon are volatile in the applied method. It is further advantageous that precise structures can be generated with sizes in the range of nanometers by the method. Further, the method offers arrangement possibilities for the third dimension of the layer to be structured, that is, into the depth of the layer.

In the following, the invention will be described more fully with reference to embodiment examples and accompanying illustrations.

DESCRIPTION OF THE PREFERRED EMBODIMENT EXAMPLES

EXAMPLE 1

The example relates to the generation of a trench in an amorphous carbon layer by a commercial scanning force microscope, wherein the amorphous carbon layer is RF-sputtered at room temperature with argon.

A contact mode cantilever of doped silicon single crystal with a spring constant of approximately 0.5 N/m is used as probe. Both the specimen with the layer of amorphous carbon and the cantilever are electrically contacted and are connected by a constant current source which can be regulated but which is still switched off at first.

The topography of the specimen surface is recorded in the area to be structured in the usual imaging mode of the scanning force microscope. The line along which a trench is to be written into the carbon is defined by lithography software. The cantilever is moved to the starting point of the desired line. After it has moved at a selected speed of e.g., 1 μm/s over the carbon surface along the programmed line to its end point, the DC is switched on, wherein the voltage at the specimen is positive relative to the cantilever. The voltage of the constant current source can be limited, e.g., to a maximum of 10 Volts and the current can be in the range of a few nA. It is possible to more over the desired structure one or more times. At the conclusion of structuring, the DC voltage is switched off.

The results of the structuring can be immediately detected by means of a topography photograph in conventional imaging mode in the same scanning force microscope with the same probe that was used for structuring.

Figure 1:
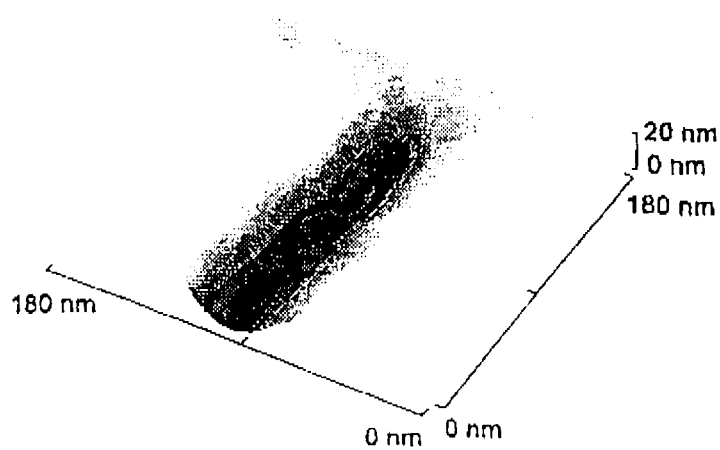
FIG. 1 shows the obtained line structure of the inventive method according to the first example.

The obtained line structure is shown in FIG. 1. The trench degenerated by field-induced oxidation in the scanning force microscope has a half-width of 35 nm and a depth of 20 nm.

EXAMPLE 2

This example relates to the complete removal of a 250-nm thick amorphous carbon layer in a selected region. The carbon layer is located in this case on a silicon single crystal substrate and is removed by means of a commercial scanning force microscope in that the area to be removed is scanned by 12 volts DC voltage at 3 μm/s.

Figure 2:
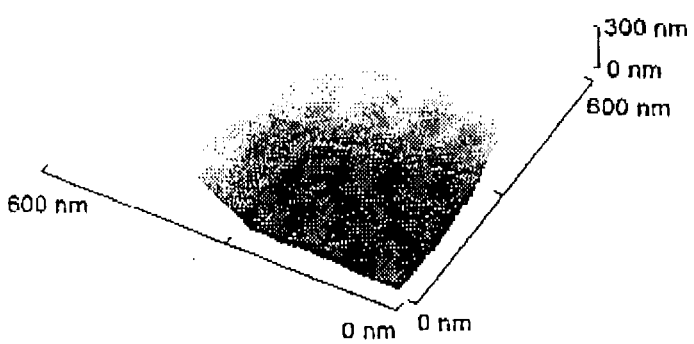
FIG. 2 shows a scanning force microscope image of the inventive method according to the second example.

The scanning force microscope image according to FIG. 2 shows the results of the completed structuring. The step height in the scanning force microscope illustration conforms to the layer thickness of the amorphous carbon determined by the profilometer.

EXAMPLE 3

This example concerns the generation of a narrow interruption in a AuPd conductor path using an etch mask of amorphous carbon produced by local field-induced oxidation in the scanning force microscope.

In this case, a conductor path structure manufactured by optical and electron beam lithography was coated with an amorphous carbon layer with an approximate layer thickness of 8 nm. For this purpose, the carbon was deposited by sputtering from a graphite crucible with krypton as working gas. A narrow trench was then written into this layer over one of the conductor paths at an angle of approximately 60 degrees to this conductor path by the method according to the invention for local oxidation of films of amorphous carbon. The carbon layer served as an etch mask for the subsequent argon-ion etching, so that the conductor path was only etched at the location where it was not covered by carbon. The etching process was controlled during the etching by measurement of the electrical resistance of the conductor path.

Figure 3:
FIG. 3 shows the obtained structure in accordance with the third example of the inventive method.

The results of the structuring are shown in FIG. 3. The conductor path interruption is approximately 30-nm wide.

While the foregoing description and drawings represent the preferred embodiments of the present invention, it will be obvious to those skilled in the art that various changes and modifications may be made therein without departing from the true spirit and scope of the present invention.

What is claimed is:

1. A method for nanostructuring of amorphous carbon layers, comprising the steps of:
    activating a local field-induced reaction of the carbon by an electrically conductive or semiconducting probe which is located above or guided over the amorphous carbon layer at a distance in which the electric conduction mechanism of the field emission or of tunneling is possible; and
    applying an electric voltage to the probe relative to the layer at locations where depressions are introduced in the layer or the layer is to be removed;
    wherein the reaction products which are produced are volatile and directly structure at least one trench in the amorphous carbon layer.

2. The method according to claim 1, wherein the electrically conductive or semiconducting probe is located at a distance of up to 10 nm above the amorphous carbon layer or is guided over the latter.

3. The method according to claim 1, wherein a negative DC voltage potential is applied to the probe with a minimum voltage in the range of 3 to 8 volts relative to the layer or an AC voltage is applied.

4. The method according to claim 1, wherein the distance between the electrically conductive or semiconducting probe and the amorphous carbon layer is defined by an electrically insulating layer with a thickness of up to several nanometers which is located on the surface of the probe.

5. The method according to claim 1, wherein the reaction is carried out in an oxygen environment, wherein oxides of the carbon occur as reaction products.

6. The method according to claim 1, wherein the reaction is carried out in a hydrogen environment or a nitrogen environment.

7. The method according to claim 1, wherein the nanostructuring is carried out by means of a scanning probe microscope, wherein the electrically conducting or semiconducting probe of the microscope is used for the field-induced reaction of the carbon.

8. The method according to claim 1, wherein a structured electrode whose structure is formed as the negative of the nanostructure to be achieved in the layer is used as electrically conducting probe.

9. The method according to claim 1, wherein the distance between the electrically conductive or semiconducting probe and the amorphous carbon layer is changed periodically over time during the structuring.

10. The method according to claim 3, wherein the negative DC voltage potential is changed periodically over time during the structuring.

11. The method according to claim 1, wherein a negative DC voltage potential is applied to the probe with a minimum voltage in the range of 3 to 8 volts relative to the layer or an AC voltage is applied wherein an electrically conductive or semiconducting probe of silicon is used, and wherein the polarity of the DC voltage potential is reversed during the structuring at determined intervals for determined times, so that a layer of silicon oxide is formed on the surface of the probe by field-induced oxidation or a layer of this kind is reproduced.

12. The method according to claim 3, wherein, instead of a DC voltage source, a constant current source is used, wherein the transition resistance between the electrically conductive or semiconducting probe and the amorphous carbon layer is to be adjusted in such a way that a determined minimum voltage is achieved during the structuring.

13. The method according to claim 1, wherein the method is used for generating structures which represent digital or analog information for the purpose of storing such information in amorphous carbon layers.

* * * * *